United States Patent
Baniecki et al.

(10) Patent No.: US 8,344,386 B2
(45) Date of Patent: Jan. 1, 2013

(54) LAMINATED THIN-FILM DEVICE, MANUFACTURING METHOD THEREOF, AND CIRCUIT

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 65 days.

(21) Appl. No.: 12/926,733

(22) Filed: Dec. 7, 2010

(65) Prior Publication Data
US 2011/0073993 A1 Mar. 31, 2011

Related U.S. Application Data

(62) Division of application No. 10/458,678, filed on Jun. 11, 2003, now Pat. No. 7,867,869.

(30) Foreign Application Priority Data

Jun. 21, 2002 (JP) ................................. 2002-181463

(51) Int. Cl.
*H01L 29/00* (2006.01)
(52) U.S. Cl. ............ 257/68; 257/71; 257/310; 257/532; 257/E27.016; 257/E27.048; 257/E29.218
(58) Field of Classification Search .................. 257/298, 257/310, 68, 71, 532, E27.016, 48, E29.218
See application file for complete search history.

(56) References Cited

U.S. PATENT DOCUMENTS

| 6,128,178 | A | 10/2000 | Newns | 361/305 |
| 6,514,814 | B2 * | 2/2003 | Jaing et al. | 438/240 |
| 6,720,607 | B1 | 4/2004 | Basceri et al. | 257/306 |

FOREIGN PATENT DOCUMENTS

| JP | 02-106068 | 4/1990 |
| JP | 06-013572 | 1/1994 |
| JP | 10-178153 | 6/1998 |

OTHER PUBLICATIONS

Sze, "Semiconductor Devices", 1985, pp. 405 and 417.

* cited by examiner

*Primary Examiner* — Minchul Yang
(74) *Attorney, Agent, or Firm* — Kratz, Quintos & Hanson, LLP

(57) ABSTRACT

The present invention provides a novel capacitor element, laminated thin-film device, and circuit wherein the capacitance dependency on voltage can be appropriately adjusted, and a technology for manufacturing such a capacitor element and laminated thin-film device. In the capacitor element that comprises a pair of electrode layers and a dielectric layer disposed between the electrode layers, a well region where an ion is implanted is disposed in the dielectric layer, and the C-V curve between the electrode layers is shifted or shifted and expanded in at least one direction of the plus direction and minus direction with respect to the voltage axis.

20 Claims, 9 Drawing Sheets

FIG. 1
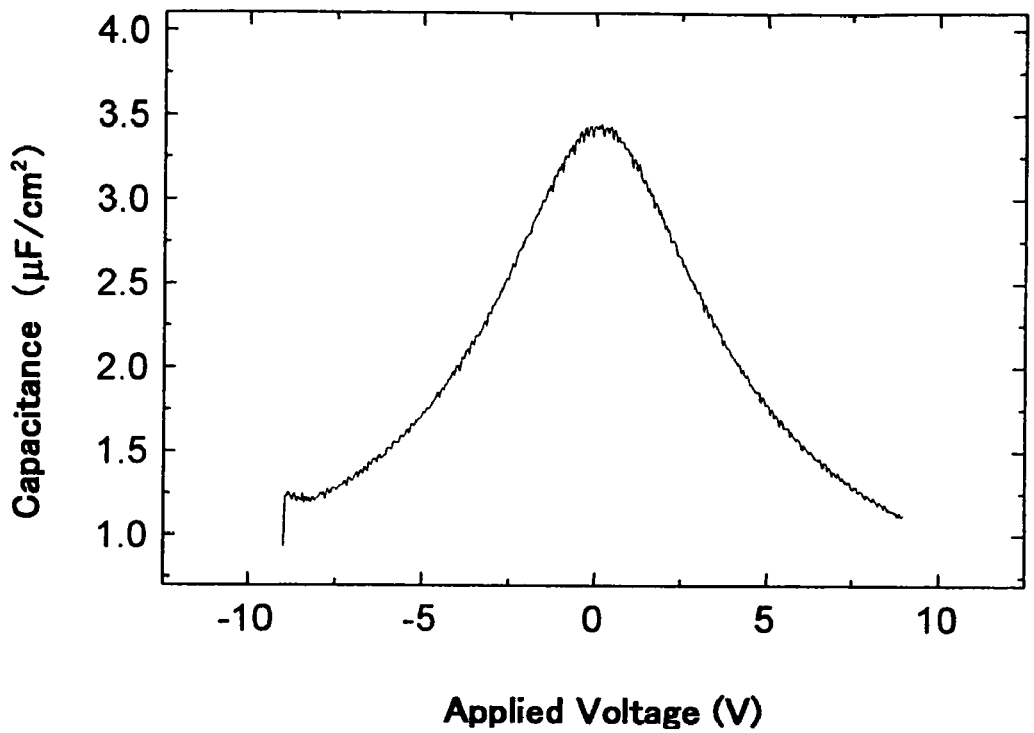
FIG. 2B  FIG. 2A  FIG. 2C
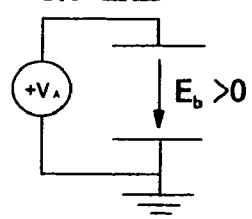 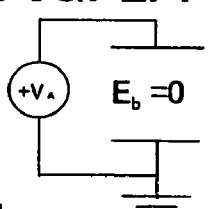 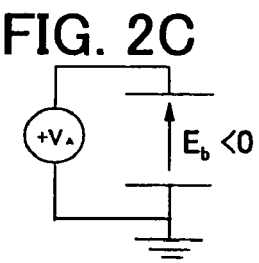
FIG. 2D
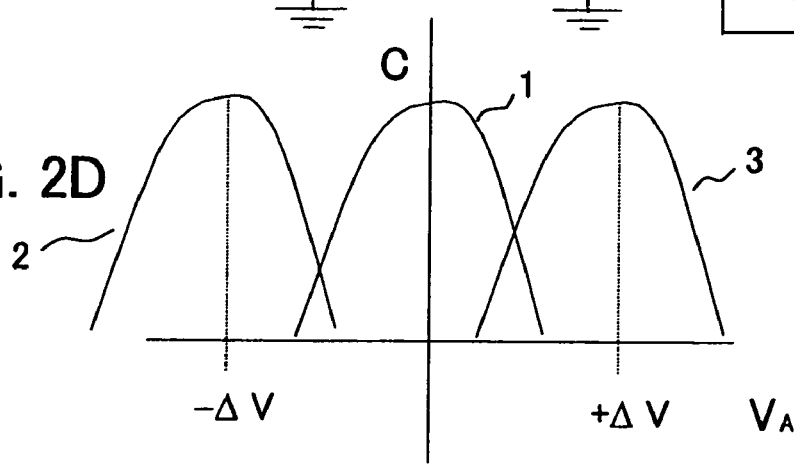

FIG. 6A
FIG. 6B
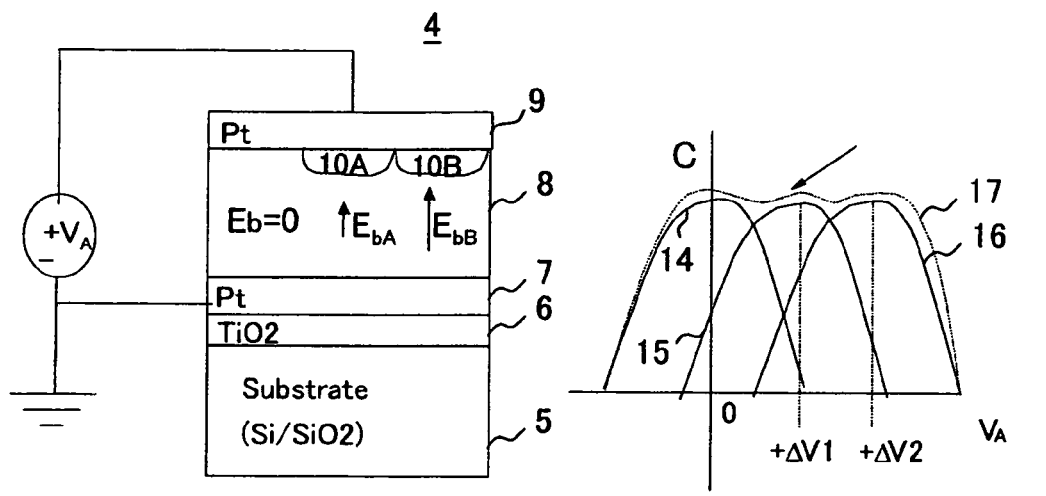
FIG. 7A
FIG. 7B
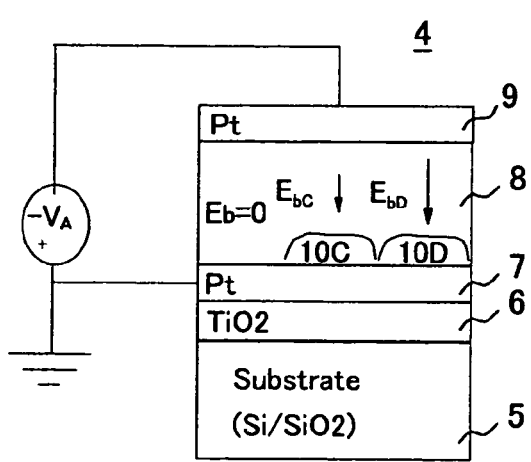

LAMINATED THIN-FILM DEVICE, MANUFACTURING METHOD THEREOF, AND CIRCUIT

CROSS-REFERENCE TO RELATED APPLICATION

This application is a division of U.S. patent application Ser. No. 10/458,678 filed Jun. 11, 2003 now U.S. Pat. No. 7,867,869 which application is based upon and claims the benefit of priority from Japanese Patent Application No. 2002-181463, filed Jun. 21, 2002, the entire contents of which are incorporated herein by reference.

BACKGROUND OF THE INVENTION

1. Field of the Invention

The present invention relates to a capacitor element, a laminated thin-film device using a capacitor element, and a circuit using a capacitor element. More particularly, the present invention relates to a capacitor element that has, in the dielectric layer, a well region for shifting or shifting and expanding a capacitance-voltage curve (called, hereafter, as C-V curve) between electrode layers in at least one direction of the plus direction and the minus direction with respect to the voltage axis, a laminated thin-film device using the capacitor element, and a circuit using the capacitor element.

2. Description of the Related Art

Integrated thin-film capacitors that use perovskite materials with a high relative dielectric constant are used for various applications, such as a storage node capacitor of a dynamic RAM (DRAM), a decoupling capacitor, a voltage tunable capacitor in a high frequency region (RF), a microwave filter, a phase shifting element in a phased array antenna, and a pyroelectric sensor, and are therefore being energetically researched at the moment.

The capacitance of the dielectric layer is given by $C = \epsilon \epsilon_0 A/d$ (wherein C is the dielectric constant of the dielectric layer, .epsilon. is the relative dielectric constant of the dielectric layer, $\epsilon_0$ is the dielectric constant of the vacuum, A is a cross-sectional area of an electrode, and d is the distance between electrode layers), and since .epsilon. depends on the voltage applied between the electrode layers, C also changes depending on the voltage. The capacitance dependency on voltage of the perovskite material with a high dielectric constant in a thin film can be described clearly by the Landau Ginsberg Devonshire (LGD) theory.

Because of such a capacitance dependency on voltage, the capacitance dependency on voltage has an extremely important meaning in an integrated thin-film capacitor.

There are some dielectrics that have a low capacitance dependency on voltage, but such dielectrics normally have a low dielectric constant. Therefore for a capacitor element for laminated thin-film devices that have a high necessity to use a dielectric layer with a high dielectric constant, the capacitance dependency on voltage has an especially significant meaning.

In the case of a storage node capacitor of a DRAM, decoupling capacitor, etc., for example, it is desirable that the capacitance dependency on voltage should be as low as possible. In the case of a voltage tunable capacitor, on the other hand, it is desirable to optimize the capacitance dependency on voltage.

Because of such a reason, a laminated thin-film device wherein the capacitance dependency on voltage can be appropriately adjusted is desired.

However, an effective means has not been available, except by selecting the material to be used, such as for the dielectric layer.

SUMMARY OF THE INVENTION

With the foregoing in view, it is an object of the present invention to provide a new capacitor element, laminated thin-film device and circuit wherein the capacitance dependency on voltage can be appropriately adjusted, and a technology for manufacturing such a capacitor element and laminated thin-film device.

Still other objects and advantages of the present invention will be clarified by the descriptions herein below.

According to an aspect of the present invention, a laminated thin-film device to be provided has a capacitor element comprising a pair of electrode layers, a dielectric layer disposed between the electrode layers, and a well region for ion implantation that is disposed in the dielectric layer for shifting or shifting and expanding a C-V curve between the electrode layers in at least one direction of the plus direction and minus direction with respect to the voltage axis.

When the capacitor element according to the present invention is used, the capacitance dependency on voltage will be easily adjusted by appropriately shifting or shifting and expanding the C-V curve between the electrode layers in at least one direction of the plus direction and minus direction with respect to the voltage axis.

Such a capacitor element can be used not only for a unipolar application wherein the polarity is limited to plus or minus, but for a bipolar application wherein the polarity spreads over a plus region as well as a minus region. Also the capacitor element can be used not only for a non-switching application that is used with one specific voltage, but for a switching application that is used with a plurality of voltages.

In the case of a non-switching application, wherein only one specific voltage, whereby high capacitance is obtained, is selected, it is sufficient to shift the capacitance dependency on voltage, but in the case of a switching application, it is important that the capacitance dependency on voltage is low within a specific voltage, range, therefore expanding the C-V curve is important.

A capacitor element for a unipolar or non-switching application is particularly suitable as a decoupling capacitor and a storage node capacitor of a DRAM.

It is preferable that the well region disposed in the dielectric layer is formed in at least one of the top and bottom boundary faces of the dielectric layer. This is because the shift is greater, and the capacitance dependency on voltage can be easily adjusted.

It is also preferable that the capacitor element is formed on a semiconductor substrate, and the semiconductor substrate is made from at least one element selected from the group consisting of Si, Ge, and IIIA group elements and VA group elements of the periodic table, one or more insulation layers made from a material selected from the group consisting of an oxide, a nitride, an oxynitride, a xerogel, and a mixture thereof are formed over the semiconductor layer, one or more adhesive layers made from a conductive or insulating material selected from the group consisting of a metal, an alloy, a metal oxide, a metal nitride, and a mixture thereof are placed over the semiconductor, and the electrode layers are made from a material selected from the group consisting of a transition metal, a noble metal, an alloy containing noble metal, and a conductive noble metal oxide. This is because laminated thin-film devices suitable for various applications, including a storage node capacitor of a DRAM, decoupling capacitor, voltage tunable capacitor in RF, microwave filter, and phase shifting element of a phased array antenna and pyroelectric sensor, can be obtained.

It is also preferable that the dielectric layer is made from a material having a perovskite crystal structure expressed by the structural formula $ABO_3$ (wherein B is one or more elements selected from the group of IVB group, VB group, VIB group, VIIB group and IB group elements of the periodic table, and A is one or more elements having electric charges in the range from +1 to +3), or the dielectric layer is made from a material having a pyrochlore structure expressed by the structural formula $A'_2B'_2O_x$ (wherein x is 6 or 7, B' is one or more elements selected from the group of IVB group, VB group, VIB group, VIIB group and IB group elements of the periodic table, and A' is one or more elements having electric charges in the range from +1 to +3), and more specifically, the dielectric layer is made from a material selected from the group consisting of barium titanate, strontium titanate, barium strontium titanate, bismuth titanate, strontium bismuth tantalate, strontium bismuth niobate, strontium bismuth niobate tantalate, lead zirconate titanate, lanthanum lead titanate zirconate, potassium niobate, magnesium lead niobate, and those substances to which an ion is implanted. This is because a high performance capacitor, wherein the capacitance dependency on voltage can be appropriately adjusted, can be obtained.

It is preferable that the ion implanted into the well region is an ion that has an electric charge lower than A or A', or an ion that has an electric charge higher than A or A', or the ion implanted into the well region is an ion that has an electric charge lower than B or B', or an ion that has an electric charge higher than B or B'. This is because the capacitance dependency on voltage can be efficiently adjusted.

For the application, it is preferable that the laminated thin-film device is a decoupling capacitor. This is because a decoupling capacitor that can be used at a desired voltage level can be easily created by appropriately shifting the C-V curve between the electrode layers in the plus direction or minus direction with respect to the voltage axis.

According to another aspect of the present invention, a manufacturing method for a laminated thin-film device to be provided is a manufacturing method for a laminated thin-film device that has a capacitor element having a pair of electrode layers and a dielectric layer disposed between the electrode layers, comprising a first step of performing masking of the dielectric layer, a second step of implanting an ion into the dielectric layer, a third step of removing the masking, a fourth step of repeating the first to third steps when necessary, and a fifth step of annealing.

In the second step of implanting an ion, it is preferable that a well region is formed in at least one of the top and bottom boundary faces of the dielectric layer, and a specific C-V curve is obtained by selecting or changing at least one condition selected from the group consisting of conditions of the type of material to be used for the dielectric layer, the type of ion to be implanted, the implementation energy, the implantation angle, the implantation time, the position, width and depth of the dielectric layer, and the concentration of the implanted ion.

It is also preferable that the dielectric layer is made from a material having a perovskite crystal structure expressed by the structural formula $ABO_3$ (wherein B is one or more elements selected from the group of IVB group, VB group, VIB group, VIIB group and IB group elements of the periodic table, and A is one or more elements having electric charges in the range from +1 to +3), and the ion to be implanted is an ion that has an electric charge lower than A, or an ion that has an electric charge higher than A, or an ion that has an electric charge lower than B, or an ion that has an electric charge higher than B.

It is also preferable that the ion beam intensity to implant the ion is in the range from 5 to 500 KeV, and/or the ion implantation angle is in the range from 0 to 90°.

By such a manufacturing method, the capacitance dependency on voltage can be easily adjusted by appropriately shifting or shifting and expanding the C-V curve between the electrode layers in at least one direction of the plus direction and minus direction with respect to the voltage.

According to still another aspect of the present invention, a circuit to be provided is a circuit wherein capacitor elements that respectively comprise a pair of electrode layers, a dielectric layer disposed between the electrode layers, and a well region disposed in the dielectric layer for shifting or shifting and expanding the C-V curve between the electrode layers in at least one direction of the plus direction and minus direction with respect to the voltage axis, are connected in parallel, or in series, or in a combination of parallel and series.

This is because a desired capacitance can be easily implemented on the circuit at-a desired voltage value or in a desired voltage range, when capacitor elements, wherein the C-V curves between the electrode layers are appropriately shifted or shifted and expanded in at least one direction of the plus direction and minus direction with respect to the voltage axis, are appropriately connected in parallel, or in series, or in a combination of parallel and series for use, as mentioned above.

Other features of the present invention will become more apparent as the description proceeds taken in conjunction with the accompanying drawings.

BRIEF DESCRIPTION OF THE DRAWINGS

FIG. 1 is a graph depicting an example of the capacitance dependency on voltage of BST;

FIG. 2A to FIG. 2C are model diagrams depicting the state of the existence of an inner electric field, and FIG. 2D is a model diagram depicting the shift of the C-V curve that occurs as a result;

FIG. 6A is a cross-sectional model diagram depicting a laminated thin-film device comprising a capacitor element that has an undoped region, and two doped well regions in a top boundary face of the dielectric layer, and FIG. 6B is a model diagram depicting the shift and expansion of the C-V curve thereof;

FIG. 7A is a cross-sectional model diagram depicting a laminated thin-film device comprising another capacitor element that has an undoped region and two doped well regions in a bottom boundary face of the dielectric layer, and FIG. 7B is a model diagram depicting the shift and expansion of the C-V curve thereof;

DESCRIPTION OF THE PREFERRED EMBODIMENTS

Figure 3A:
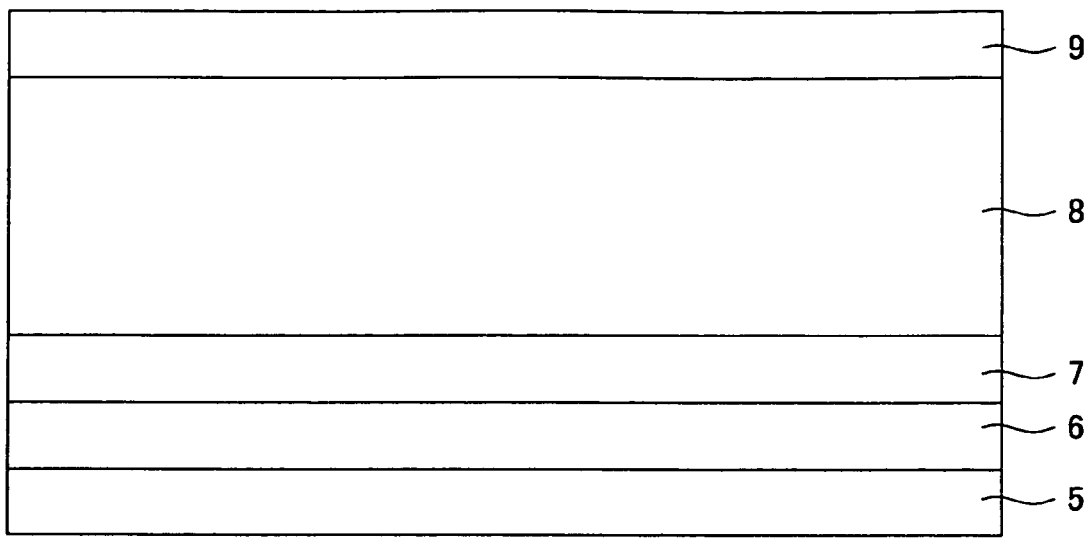
FIG. 3A is a model diagram depicting the cross-sectional structure of a laminated thin-film device comprising a capacitor element having an undoped dielectric layer.

Embodiments of the present invention will now be described with reference to the drawings, examples, etc. These drawings, examples, etc. as well as the descriptions are for showing examples of the present invention, and shall not limit the scope of the present invention. It is needless to say that other embodiments are within the scope of the present invention as long as these embodiments adhere to the essential character of the present invention. In the drawings, the same elements are denoted with the same reference numerals. In these drawings, elements related to the present invention are not always based on the same scale.

FIG. 1 shows the capacitance dependency on voltage of $(Ba,Sr)TiO_3$, which is a material having a high dielectric constant. In such a material, the maximum value of capacitance appears at zero DC volts, as shown in FIG. 1, if an internal electric field does not exist.

If an internal electric field exists, however, the maximum value of capacitance can be shifted to plus or minus with respect to the voltage axis.

For example, FIG. 2A is a model diagram in the case of the internal electric field Eb=0. In FIG. 2A, Va is the voltage applied. In this case, the C-V curve shows the maximum value of capacitance at zero volts, as the curve 1 in FIG. 2D shows.

Whereas FIG. 2B is a model diagram in the case of the internal electric field Eb>0. The arrow mark indicates the direction of the vector of the internal electric field. Accordingly, when the internal electric field has an electric field vector facing the electrode at the lower potential side, the maximum value of capacitance shifts for $\Delta V$ in the minus direction with respect to the voltage axis, as the curve 2 in FIG. 2D shows.

FIG. 2C is a model diagram in the case of the internal electric field Eb<0. Accordingly, when the internal electric field has an electric field vector facing the electrode at the higher potential side, the maximum value of capacitance shifts for $\Delta V$ in the plus direction with respect to the voltage axis, as the curve 3 in FIG. 2D shows.

It is known that such a shift occurs if atoms having a plus or minus charge are introduced into a material having a high dielectric constant.

According to the present invention, an internal electric field is generated by disposing, in a dielectric layer, a well comprising an ion having a plus charge (donor dopant) or an ion having a minus charge (acceptor dopant) in the crystal lattice of the dielectric layer, so as to shift the C-V curve between the electrode layers in the plus direction or minus direction with respect to the voltage axis, and to shift the maximum value of capacitance in the plus or minus direction with respect to the voltage axis.

Also, when the well region with an implanted ion is disposed in a part of the dielectric layer using this technology, it is also possible to expand the C-V curve between the electrode layers in the plus direction or minus direction with respect to the voltage axis.

Figure 3B:
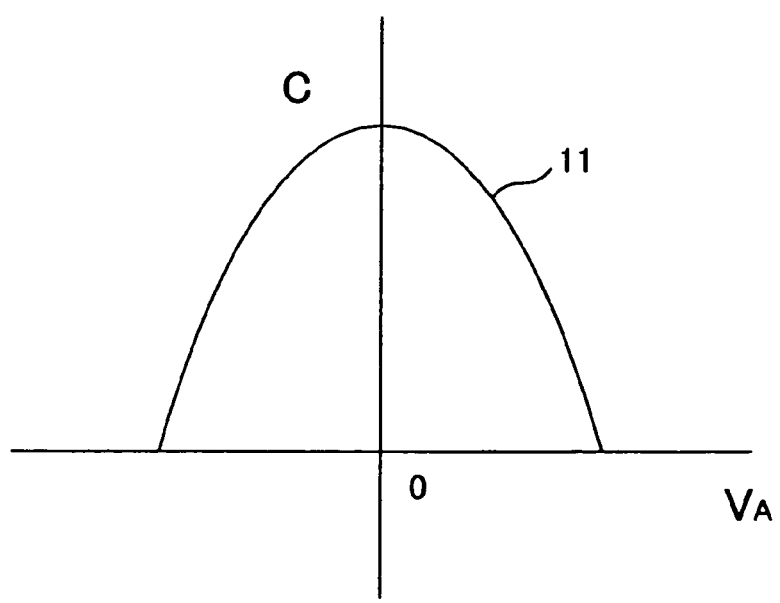
FIG. 3B is a model diagram depicting the C-V curve thereof.

This state will be described with reference to FIG. 3 to FIG. 5. FIG. 3A is a cross-sectional model diagram of a laminated thin-film device 4 comprising a semiconductor layer 5, adhesive layer 6, bottom electrode layer 7, dielectric layer 8, and top electrode layer 9, wherein the bottom electrode layer 7 and the top electrode layer 9 are a pair, and this laminated thin-film device 4 has a capacitor element that has the dielectric layer 8 as the dielectric layer sandwiched by the pair of electrode layers. FIG. 3B shows a capacitance dependency on voltage between the electrode layers, wherein the maximum value of the capacitance is at zero V.

Figure 4A:
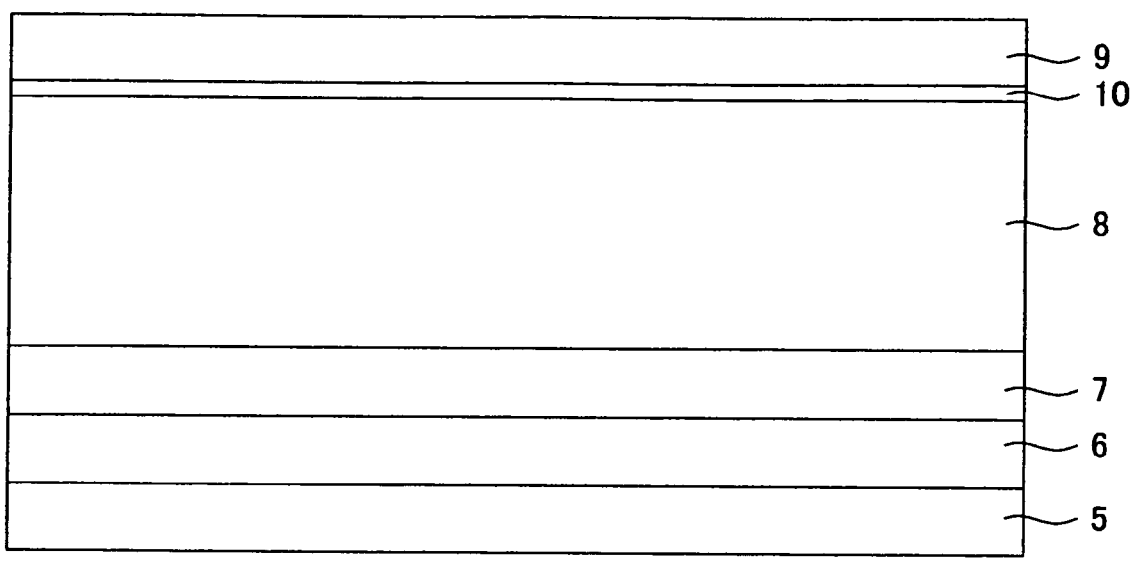
FIG. 4A is a model diagram depicting the cross-sectional structure of a laminated thin-film device having a capacitor element that has a doped dielectric layer.
Figure 4B:
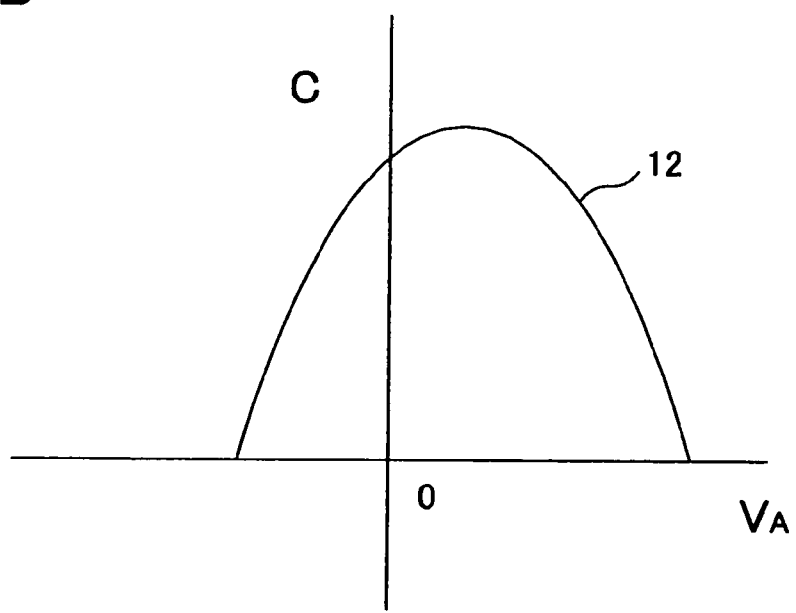
FIG. 4B is a model diagram depicting the shift of the C-V curve thereof.

FIG. 4A is a cross-sectional model diagram of the laminated thin-film device 4 wherein an ion is doped into the entire surface of the same dielectric layer so that the well region 10 is disposed on the entire surface of the boundary face of the dielectric layer. FIG. 4B shows a state when the C-V curve shifts in the plus direction with respect to the voltage axis at this time. In this way, a shift of the C-V curve with respect to the voltage axis becomes possible.

Figure 5:
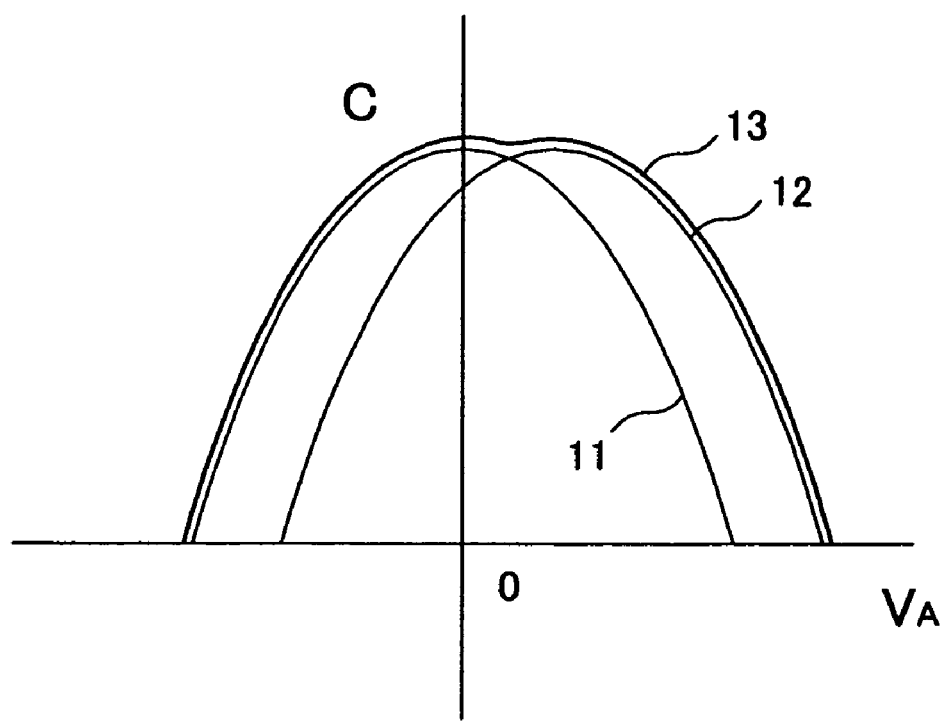
FIG. 5 is a model diagram depicting the capacitance dependency on voltage between the electrode layers when the capacitor elements in FIG. 3A and FIG. 4A are connected in parallel.

FIG. 5 shows the capacitance dependency on voltage between the electrode layers wherein the capacitor elements in FIG. 3A and FIG. 4A are connected in parallel. The C-V curve in this case appears as the sum 13 of the curve 11 in FIG. 3B and the curve 12 in FIG. 4B, and as a result, the C-V curve between the electrode layers shifts and expands in the plus direction with respect to the voltage axis. In other words, the maximum value of the capacitance shifts in the plus direction with respect to the voltage axis, and the width of the C-V curve increases, so that a stable capacitance can be obtained in a wide voltage range.

FIG. 4A is an example wherein "the well region with an implanted ion that is disposed in the dielectric layer, for shifting or shifting and expanding the C-V curve between the electrode layers in at least one direction of the plus direction and minus direction with respect to the voltage axis" according to the present invention, is disposed in the entire boundary face of the dielectric layer.

In the present invention, however, it is also possible to dispose such a well region inside the dielectric layer, or in a part of the inside of the dielectric layer and/or in a part of the boundary face. The position, width and depth of the well region can be determined by selecting the ion to be used, the ion beam intensity and the ion implantation angle, in particular by selecting the ion beam intensity. In terms of the efficiency of the internal electric field, it is preferable to dispose the well region in the boundary face of the dielectric layer.

If the well region is disposed not in the entire boundary face of the dielectric layer but in a part thereof, then the C-V curve between the electrode layers shifts and expands in the plus direction with respect to the voltage axis, just like the case of connecting the capacitor elements in FIG. 3A and FIG. 4B in parallel. Therefore, it is preferable to dispose the well region in the entire boundary face of the dielectric layer if the target is to only shift the C-V curve, and to dispose the well region in a part of the dielectric layer if the target is to shift and expand the C-V curve.

When a well region is disposed in the boundary face of the dielectric layer, the well region can be disposed at least in one of the top and bottom boundary faces of the dielectric layer. There is no particular limit to the number of well regions.

The capacitor elements having the above structure can be formed on a semiconductor substrate.

The material of the semiconductor substrate can be selected from the group consisting of Si, Ge, and IIIA group elements and VA group elements of the periodic table. Specifically, SiGe, GaAs, InAs, or InP can be used.

When a multi-layer structure is created with a semiconductor substrate as the base, it may be preferable that the insulation layer and the adhesive layer are formed over the semiconductor substrate to electrically insulate from the top structure thereof and to insure adhesion with the top structure. Each of the layers may be composed of a plurality of layers respectively, or one layer may serve both for the electrical insulation and adhesion.

Materials that can be used for the insulation layer are oxides, nitrides, oxynitrides, xerogels, and mixtures thereof. For example, when the semiconductor is Si, $SiO_2$ can be used for the insulation layer.

Materials that can be used for the adhesive layer are electrically conductive or insulating materials such as metals, metal alloys, metal oxides, metal nitrides and mixtures thereof. For example, Pt, Ir, Zr, Ti, titanium oxide, iridium oxide, platinum oxide, zinc oxide, TiN, TiAlN, TaN and TaSiN can be used.

The material that can be used for the electrode layer according to the present invention is not particularly limited, but it is preferable to select from the group consisting of transition metals, noble metals, alloys containing noble metals, and electrically conductive noble metal oxides. This is because reliability can be assured. Here a transition metal refers to a simple substance made of a transition element in which the d shell is filled with electrons, and a noble metal refers to Ru, Os, Rh, Ir, Pd, Pt, Ag or Au. Specifically, Pt, Ir, Ru, Rh, Os, platinum oxide, iridium oxide, ruthenium oxide, gold, Ag, Cu, Co and Ni can be used.

Materials that can be used for the dielectric layer according to the present invention may be any material as long as the material does not counter the essential character of the present invention, but what is preferable is a material having a perovskite crystal structure expressed by the structural formula $ABO_3$ (wherein B is one or more elements selected from the group consisting of elements in the IVB group, VB group, VIB group, VIIB group, and IB group of the periodic table, and A is one or more elements having an electric charge in the range from +1 to +3), and material having a pyrochlore structure expressed by the structural formula $A'_2B_2O_x$ (wherein x is 6 or 7, B' is one or more elements selected from the group of elements in the IVB group, VB group, VIB group, VIIB group, and IB group of the periodic table, and A' is one or more elements having an electric charge in the range from +1 to +3). This is because a large dielectric constant can be obtained.

A material having a perovskite crystal structure expressed by the above structural formula $ABO_3$ is not only a material having a simple perovskite structure expressed by $A1+B5+O_3$, $A2+B4+O_3$ and $A3+B3+O_3$ (numeral after A and B indicates the positive valence number), but also includes material having a composite perovskite crystal structure.

An example of a material having a simple perovskite structure expressed by $A1+B5+O_3$ is $KNbO_3$, an example of a material having a simple perovskite structure expressed by $A2+B4+O_3$ is $BaTiO_3$, and an example of a material having a simple perovskite structure expressed by $A3+B3+O_3$ is $BiFeO_3$. The simple perovskite structure includes the case where the material contains a plurality of elements. An example of this is $(Ba_ySr_{1-y})TiO_3$.

An example of a material having a composite perovskite crystal structure is $PbMg_yNb_{1-y}O_3$ (y is a real number greater than 0 and less than 1).

In this way, materials having a perovskite crystal structure expressed by the above-mentioned structural formula $ABO_3$ are not limited to the case where simply A corresponds to one element and B corresponds to another element. When the ratio of the atomic number of each element is weighted and the valence numbers of the A ion and B ion are added, if the average of the two element ions has a +3 valence, then the material falls into the category of materials having a perovskite crystal structure expressed by the structural formula $ABO_3$.

In the above description, A and B are specified as being "one or more elements", because the case where a plurality of elements exist in this way is included.

This is the same for A' and B' of a material having a pyrochlore structure expressed by the structural formula $A'_2B'_2O_x$.

Therefore the above-mentioned specific compounds are in an ionically balanced state, except the substance with an ion implanted therein.

Specifically, examples of materials having a perovskite crystal structure expressed by the structural formula $ABO_3$ are barium titanate, strontium titanate, barium strontium titanate, bismuth titanate, strontium bismuth tantalate, strontium bismuth niobate, strontium bismuth niobate tantalate, lead zirconate titanate, lanthanum lead titanate zirconate, potassium niobate, and magnesium lead niobate, and those substances to which an ion is implanted.

A material having a pyrochlore structure expressed by the structural formula $A'_2B'_2O_x$ is, for example, $Pb_2(Zr, Ti)_2O_7$.

For ions to be implanted into the above-mentioned well region, ions that have lower electric charges or higher electric charges than the above-mentioned A, A', B and B' respectively can be used according to the target shift and expansion of the capacitance-voltage curve. If each of A, A', B and B' is a plurality of elements, it is preferable to use an ion having an electric charge lower than the element having the lowest electric charge among the plurality of elements, or an ion having an electric charge higher than the element having the highest electric charge among the plurality of elements.

This is because by these ions, or by combining these ions, the capacitance-voltage curve can be shifted in any direction of the plus direction and minus direction, and the capacitance-voltage curve can be expanded as desired.

For the decoupling capacitor wherein the range of voltage values to be required is narrow and constant, only shifting the capacitance-voltage curve is sufficient, and when high capacitance is required for a wide voltage range, such as in the case of a storage node capacitor of a DRAM, it is preferable to expand the capacitance-voltage curve.

In the case of a voltage tunable capacitor in RF, microwave filter, phase shifting element in a phased array antenna, and pyroelectric sensor, only shifting the capacitance-voltage curve may be sufficient, or shifting and expanding the capacitance-voltage curve is preferable, depending on the application.

A possible method for manufacturing the above-mentioned capacitor element is executing a first step of performing masking for implanting an ion into a specific part of the dielectric layer, a second step of implanting an ion into this dielectric layer, and a third step of removing the masking, for one or more times, and executing another step of annealing for recovering the regularity of the crystal lattice structure in the dielectric layer, when the structure comprising a pair of electrode layers and the dielectric layer disposed between the electrode layers, is created.

An example of the case of forming a capacitor element on the semiconductor substrate is creating a laminated thin-film device by sequentially layering the semiconductor layer, insulation layer, adhesive layer, bottom electrode layer, dielectric layer, and top electrode layer. Here, the capacitor element comprises a combination of the bottom electrode layer and top electrode layer, which are a pair, and the dielectric layer disposed between the electrode layers. An ion is implanted into this dielectric layer.

The insulation layer can be formed by a known method, such as a sputtering method, thermal oxidation method, and chemical vapor deposition (CVD) method.

The adhesive layer can be formed by a known method, such as a vacuum evaporation method, sputtering method, and ion plating method.

The electrode layers can be formed by a known method, such as a physical vapor deposition (PVD) method, including a vacuum evaporation method, sputtering method, and ion plating method, and a plating method, including an electrolytic plating method and electroless plating method.

The dielectric layer can be formed by a sol-gel method, RF magnetron sputtering, and metal organic CVD.

A regular photoresist mask for photolithography can be used for the mask used for masking. The role of the mask is to prevent an ion from being implanted in an area other than the specific area.

A known device, such as the Eaton 3206, can be used for ion implantation.

When a plurality of ions are implanted or when an ion is implanted into a plurality of locations, masking and ion implantation are repeated.

A known device, such as an electric furnace, can be used for annealing to recover the regularity of a crystal lattice structure in the dielectric layer.

The above steps, from the first to the third, can be executed after forming the dielectric layer 8 on the bottom electrode layer 7 and before forming the top electric electrode layer 9, or immediately after forming the top electrode layer 9 or after forming the necessary layers thereafter, as shown in FIG. 3A.

However, considering the possibility of damage by ion implantation and thermal damage by annealing, the former is often preferable. In this case, if the top electrode layer is formed after annealing, the possibility of thermal damage on the top electrode layer by annealing can be prevented, so that the flexibility in the choice of materials to be used is even wider than with the bottom electrode layer, which is an advantage.

The shift and expansion of the C-V curve by the well region that is generated by ion implantation, is determined by such factors as the spread of the well region in the transverse direction and depth direction, type of dopant (implanted ion), concentration, type of material to be used for the dielectric layer, type of ion to be implanted, implantation energy, implantation angle, implantation time, etc. Therefore the shift and expansion of the C-V curve can be determined by selecting or changing at least one condition selected from the group of these factors. A plurality of different ions may be implanted into the same location.

Specifically, the ion beam intensity to implant an ion is preferably in the range from 5 to 500 KeV. With a value smaller than this range, the effect is low, and with a value greater than this range, the possibility of damage caused by ion implantation increases.

The ion implantation angle can be selected from the range from 0 to 90°. Here 0° indicates the direction perpendicular to the dielectric layer face.

Figure 11:
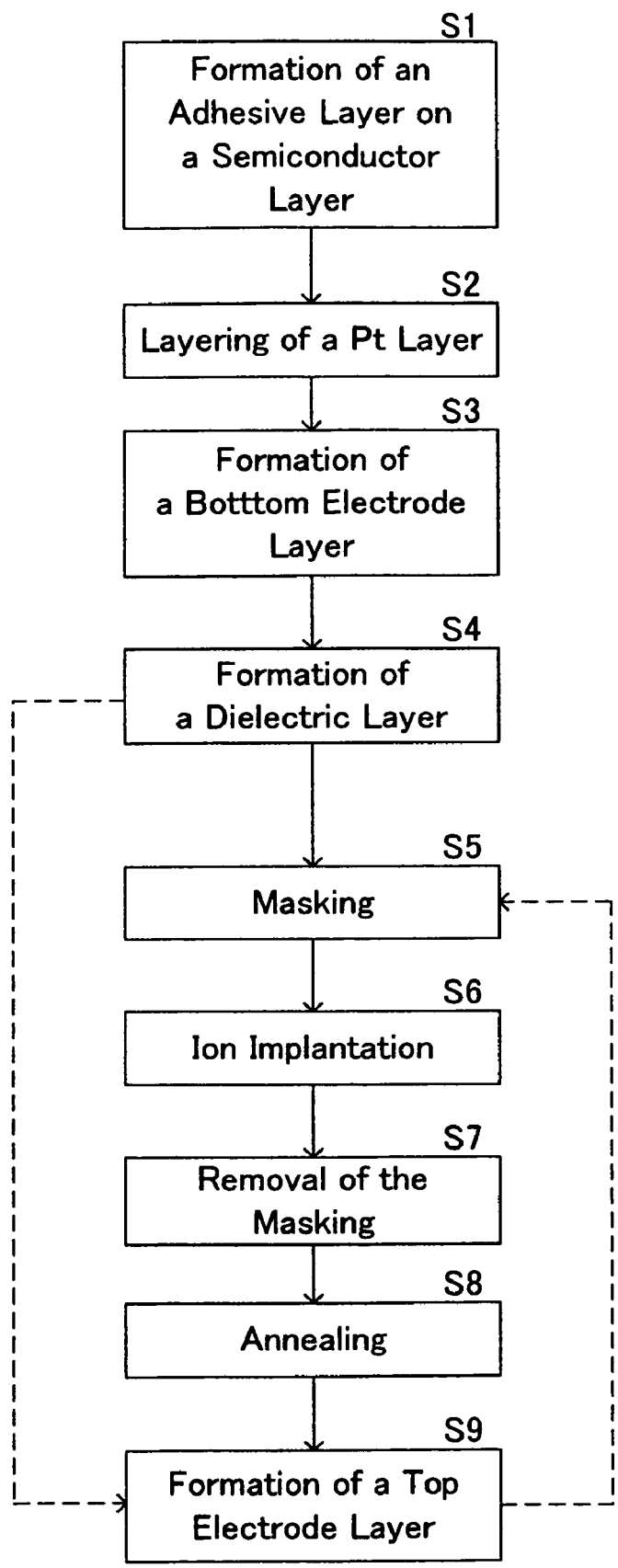
FIG. 11 is a flow chart depicting the manufacturing steps of the laminated thin-film device according to the present invention.

An example of the capacitor manufacturing step according to the present invention will now be described with reference to FIG. 11.

At first in step S1, a adhesive layer 6 made from $TiO_2$ is formed on a semiconductor layer 5 that is made from thermo-oxidation-processed Si, by the RF magnetron sputtering method, for example. Then in step S2, a Pt layer is layered thereon. And in step S3, patterns are generated by regular photolithography and are etched by such a dry etching method as Ar ion milling, so as to form a bottom electrode layer 7. Then in step S4, a dielectric layer is created by an appropriate method, patterns are generated by regular photolithography, and are etched by such a dry etching method as ion milling, so as to form the dielectric layer 8. Then in step S5, the dielectric layer 8 is masked by a photoresist mask, and in step S6, an ion is implanted. After removing the masking in step S7 and performing annealing in step S8, a top electrode layer 9 made from Pt is formed on the dielectric layer 8 according to step S9. The masking can be removed by a known method, such as using an alkali solution, and annealing can be performed in an electric furnace.

After step S4, the top electrode layer 9 made from Pt may be formed on the dielectric layer 8 according to step S9, then masking may be performed and then an ion can be implanted according to step S5.

The implantation energy, implantation angle, implantation time, and the dosage of the ion to be implanted can be determined using an implantation simulation program, such as TRIM (Transport of Ions in Matter). For the implantation energy, 10-500 KeV is often preferable, and for the dosage, $10^{13}$-$10^{18}$/$cm^2$ is often preferable. The ion implantation can be performed once or a plurality of times, and various ion implantation conditions can be combined, including the type of ion.

When the capacitor element or the laminated thin-film device is used, a circuit, having a capacitor function wherein the capacitance dependency on voltage is appropriately changed, can be obtained if the circuit is created employing a parallel structure, a serial structure, or a structure combining parallel and serial, by using, as they are, the capacitor elements wherein an ion is implanted into the entire surface of the dielectric layer, that is, capacitor elements wherein the well region stretches over the entire surface of the dielectric layer, or the capacitor elements wherein the well region is partially formed, or by using capacitor elements wherein an ion is not implanted, together with those capacitor elements.

Any circuit can be used for such a circuit unless it runs counter to the essential character of the present invention. Specifically, a circuit used for various applications, including a storage node capacitor of a DRAM, decoupling capacitor, voltage tunable capacitor in RF, microwave filter, phase shifting element of a phased array antenna, and a pyroelectric sensor, are examples thereof.

EXAMPLES

Examples of the present invention will now be described.

Example 1

FIG. 6A is a cross-sectional model diagram depicting the laminated thin-film device 4 comprising a adhesive layer 6 made from $TiO_2$, bottom electrode layer 7 made from Pt, dielectric layer 8, and top electrode layer 9 made from Pt, which are sequentially layered on the semiconductor layer 5 made from Si/SiO$_2$, wherein the dielectric layer 8 has a region that is not doped (undoped region) and two doped well regions 10A and 10B in the boundary face thereon.

For the dielectric layer, an a layer with a 80 nm thickness made from Ba$_{0.7}$Sr$_{0.3}$TiO$_3$ (in the specification, (Ba,Sr)TiO$_3$ is generally referred to as BST) was formed by metal organic CVD.

Masking was performed using a mask in a specific shape, and an ion was implanted.

An Eaton 3206 is used for the ion implantation.

When an ion is implanted, a specific C-V curve can be obtained by appropriately selecting the type of ion to be implanted, implantation energy, implantation angle, and implantation time.

For the ion to be implanted, an Mn$^{+2}$ ion was implanted in Example 1. For the ion beam intensity to implant the ion, 5 KeV was selected, and 0° was selected for the ion implantation angle.

As a result, when voltage was applied so that the top electrode became the plus side with respect to the voltage, as shown in FIG. 6A, the well region 10A for forming an internal electric field having the direction shown by the arrow mark in E$_{bA}$, was generated. In the well region 10A, the implanted Mn$^{+2}$ ion becomes an acceptor having a minus charge in the perovskite lattice.

By doping, the C-V curve shifted from the curve 14 to the right, as shown by the curve 15 in FIG. 6B, and the shift amount of the maximum value of capacitance with respect to voltage was +0.5V when the dosage was 0.5×10$^{15}$/cm$^2$, and was +1V when the dosage was 1×10$^{15}$/cm$^2$.

Then the above-mentioned mask was removed, and a new masking was performed using a mask with another shape, an ion was implanted again, and the well region 10B was generated.

As a result, when voltage was applied such that the top electrode became the plus side against ground with respect to the voltage, as shown in FIG. 6A, the well region 10B for forming an internal electric field having the direction shown by the arrow mark E$_b$B, was generated.

The mask was then removed and annealing processing was performed. Annealing was performed by holding the laminated thin-film device in an electric furnace at 400-500° C. for 30 minutes.

When an ion is implanted, the type of ion to be implanted, implantation energy, implantation angle, and implantation time can be appropriately selected independently of the case of well region 10A.

The well region 10B was formed in the same manner, except that the dosage was 2×10$^{15}$/cm$^2$. As a result, the C-V curve shifted to the right by doping, as the curve 16 in FIG. 6B shows, and the shift amount of the maximum capacitance with respect to voltage was +2V, as the curve 16 in FIG. 6B shows.

The above shift occurs when measurement is performed in the case where an ion is implanted into the entire surface of the dielectric layer, or where an electrode portion other than the electrode layer part corresponding to the location where the ion is implanted, is removed by etching processing. Whereas, the curve obtained after the above-mentioned processing is composed of the envelope of the above curves, as shown by the curve 17 in FIG. 6B.

In this way, it became possible to create a region whereby the C-V curve was shifted and expanded in the plus direction with respect to voltage, and where capacitance was high, and the voltage dependency thereof was small.

When the carrier is an electron, as in the case of BST, if the voltage is applied such that the top electrode is at the plus side against ground with respect to the voltage, as shown in FIG. 6A, carriers flow in from the bottom electrode that is an electrode where the well region does not exist, so that a leak of electric current and damage to elements, caused by forming the well region, can be minimized.

Example 2

FIG. 7A is a cross-sectional model diagram depicting a laminated thin-film device 4 that has an undoped region and two doped well regions 10C and 10D in the bottom boundary face of the dielectric layer.

The processing performed was in the same way as in Example 1, except that an Fe$^{+2}$ ion was implanted instead of an Mn$^{+2}$ ion, 200 KeV was selected as the ion beam intensity to form the well regions in the bottom boundary face of the dielectric layer, and the dosage was changed.

As a result, when voltage was applied so that the top electrode was at the minus side against ground, as shown in FIG. 7A, the well regions 10C and 10D, for forming internal electric fields in the downward direction shown by the arrow marks E$_b$C and E$_b$D, were generated.

In the well regions, the implanted Fe$^{+2}$ ion becomes an acceptor having a minus charge in the perovskite lattice.

By doping, the C-V curve shifted to the left, and the shift amount of the maximum value of capacitance with respect to voltage was −0.5V when the dosage was 1×10$^{15}$/cm$^2$, and was −1V when the dosage was 2×10$^{15}$/cm$^2$.

In the first ion implantation, a 2×10$^{15}$/cm$^2$ dosage was used. As a result, the C-V curve shifted from the curve 18 to the curve 19 in FIG. 7B.

In the next ion implantation, a 4×10$^{15}$/cm$^2$ dosage was used. As a result, the C-V curve shifted to the curve 20 in FIG. 7B, and as a result, the curve 21 was obtained as the C-V curve.

In this way, it became possible to create a region wherein the C-V curve was shifted and expanded in the minus direction against ground with respect to voltage, capacitance was high, and voltage dependency thereof was small.

Also when the carrier is an electron, as in the case of BST, if the voltage is applied so that the top electrode is at the minus side, as shown in FIG. 7A, carriers flow in from the top electrode that is an electrode where the well region does not exist, so the leak current and the damage to elements caused by forming the well region, can be minimized.

Example 3

Figure 8A:
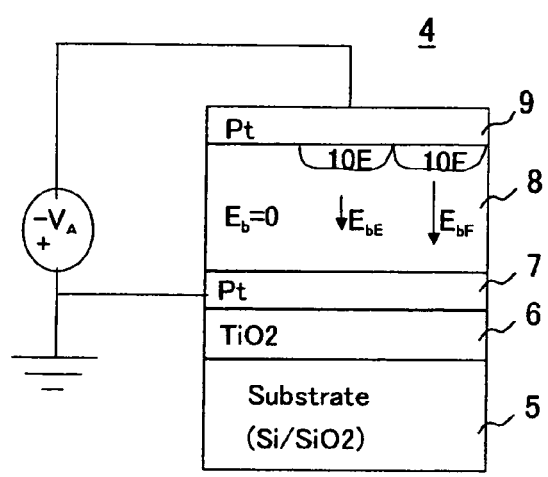
FIG. 8A is a cross-sectional model diagram depicting a laminated thin-film device comprising another capacitor element that has an undoped region and two doped well regions in the top boundary face of the dielectric layer.

FIG. 8A is a cross-sectional model diagram depicting a laminated thin-film device 4 that has an undoped region and two doped well regions 10E and 10F in the top boundary face of the dielectric layer.

The processing performed was the same as Example 1, except that a 100 nm thick Pb(Zr,Ti)O$_3$ (PZT) layer was used for the dielectric layer instead of the 80 nm thick BST layer, an a Nb$^{+5}$ ion was implanted instead of a Mn$^{+2}$ ion, 5 KeV was selected for the ion beam intensity, and the dosage was changed.

As a result, when voltage is applied so that the top electrode was at the minus side against ground, as shown in FIG. 8A, the well regions 10E and 10F for forming internal electric fields in the downward direction shown by the arrow marks E$_b$E and E$_b$F, were generated.

In the well regions, the implanted Nb$^{+5}$ ion becomes a donor that has a plus charge in the perovskite lattice.

By doping, the C-V curve shifted to the left, and the shift amount of the maximum value of capacitance with respect to voltage was −0.5V when the dosage was $2×10^{15}/cm^2$, and was −1V when the dosage was $4×10^{15}/cm^2$.

Figure 8B:
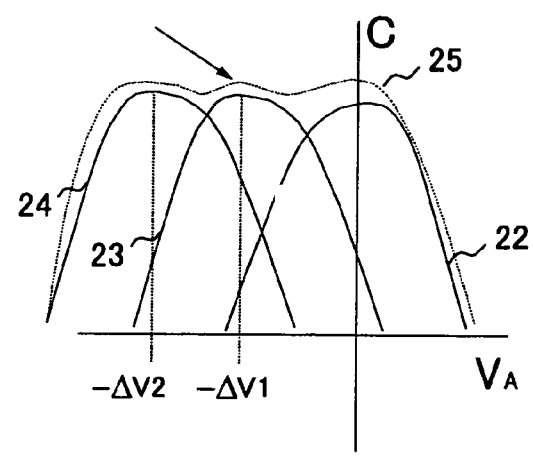
FIG. 8B is a model diagram depicting the shift and expansion of the C-V curve thereof.

In the first ion implantation, the dosage of $4×10^{15}/cm^2$ was used. As a result, the C-V curve shifted from the curve 22 to the curve 23 in FIG. 8B.

In the next ion implantation, an $8×10^{15}/cm^2$ dosage was used. As a result, the C-V curve shifted to the curve 24 in FIG. 8B, and as a further result, the curve 25 was obtained as the C-V curve.

In this way, it became possible to create a region wherein the C-V curve was shifted and expanded in the minus direction against ground with respect to voltage, capacitance was high, and the voltage dependency thereof was small.

Also when the carrier is a hole, as in the case of PZT, if voltage is applied so that the top electrode is at the minus side, as shown in FIG. 8A, holes flow in from the bottom electrode that is an electrode where the well region does not exist, so the leak of current and damage to elements caused by forming the well region, can be minimized.

Example 4

Figure 9:
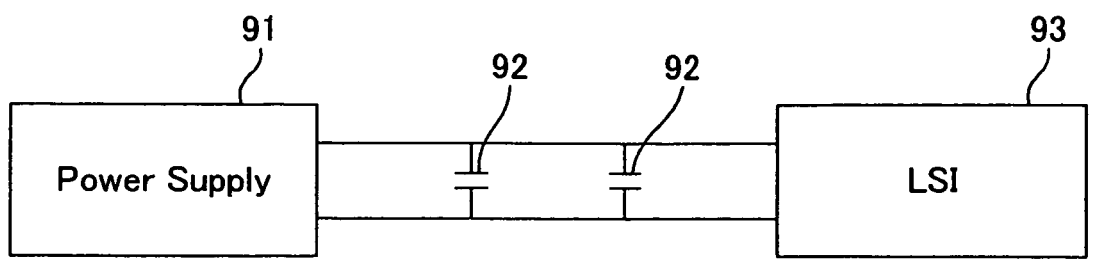
FIG. 9 is a model diagram depicting an example when decoupling capacitors according to the present invention are used in a parallel configuration between the power supply and an LSI.

FIG. 9 is an example wherein decoupling capacitors 92 according to the present invention are used between a power supply 91 and an LSI 93 in a parallel configuration. In this case, if the capacitance-voltage curve between the electrodes is shifted to the plus direction or minus direction with respect to the voltage axis for one of the decoupling capacitors, then a curve that is shifted and expanded is obtained in the parallel circuit, as shown in FIG. 5.

Example 5

Figure 10A:
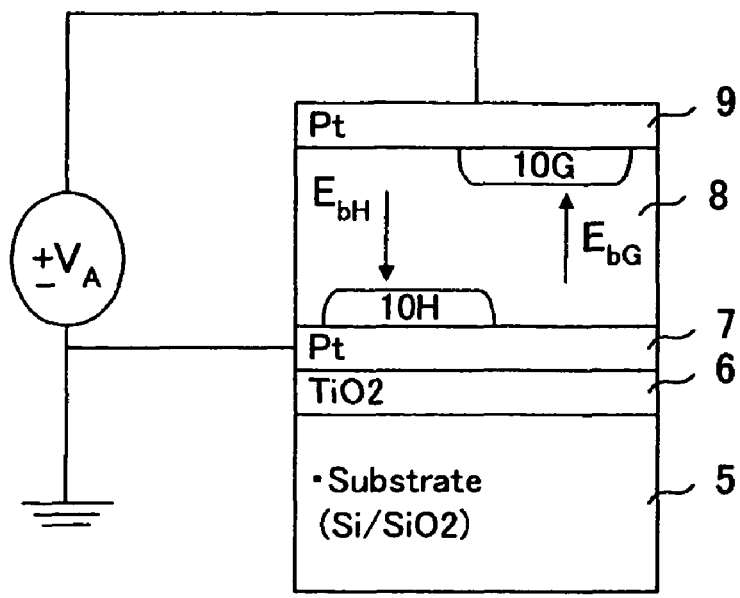
FIG. 10A is a cross-sectional model diagram depicting a laminated thin-film device comprising another capacitor element that has an undoped region and a doped well region in the top and bottom boundary faces of the dielectric layer.

FIG. 10A is a cross-sectional model diagram depicting a laminated thin-film device 4 that has an undoped region and doped well regions 10G and 10H in the top and bottom boundary faces of the dielectric layer, respectively.

The processing of the dielectric layer performed was the same as Example 1, except that an 80 nm thick BST layer was formed by RF magnetron sputtering, 200 KeV and 5 KeV were selected for the ion beam intensities, the well regions were formed in the top and bottom boundary faces of the dielectric layer by implanting an $Fe^{+2}$ ion, and the dosage was changed.

As a result, when voltage was applied so that the top electrode was at the plus side against ground, as shown in FIG. 10A, the well regions 10G and 10H, for forming the internal electric fields in the upward and downward directions shown by the arrow marks $E_bG$ and $E_bH$, were generated.

In the well regions, the implanted $Fe^{+2}$ ion becomes an acceptor having a minus charge in the perovskite lattice.

Figure 10B:
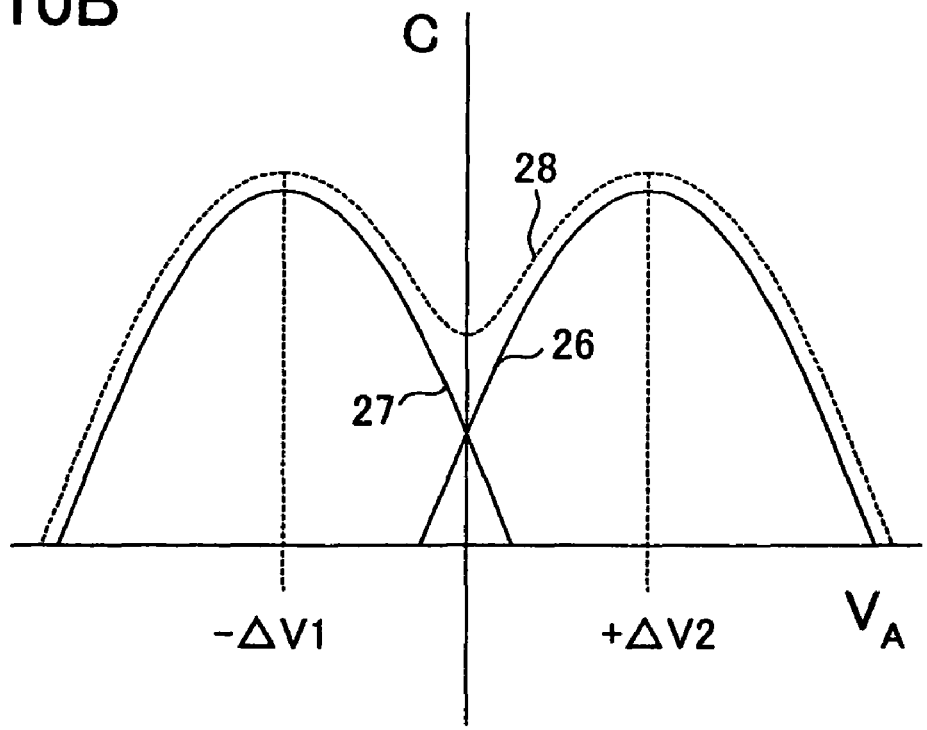
FIG. 10B is a model diagram depicting the shift and expansion of the C-V curve thereof.

By doping, the C-V curve shifted to the left and right, as shown in FIG. 10B, and the shift amount of the maximum value of capacitance with respect to voltage was +0.5V or −0.5V when the dosage was $0.5×10^{15}/cm^2$ at 5 KeV, and was +1V or −1V when the dosage was $1×10^{15}/cm^2$ at 200 KeV.

By performing implantation twice, the curve 28 composed of the envelope of the curve 26 and curve 27 was obtained.

By the present invention, a new capacitor element, laminated thin-film device, and circuit wherein the capacitance dependency on voltage can be appropriately adjusted, and a technology to manufacture such a capacitor element and laminated thin-film device are provided.

What is claimed:

1. A laminated thin-film device having a capacitor element, comprising:
    a pair of electrode layers;
    an insulating layer disposed between said electrode layers; and
    at least one well region with an implanted ion that is disposed in said insulating layer for shifting or shifting and expanding a capacitance-voltage curve between said electrode layers in at least one direction of the plus direction and minus direction with respect to the voltage axis,
    wherein each of said at least one well region defines one part of the top boundary face of said insulating layer or one part of the bottom boundary face of said insulating layer.

2. The laminated thin-film device according to claim 1, wherein said well region is disposed at least in one of the top and bottom boundary faces of said insulating layer.

3. The laminated thin-film device according to claim 2, wherein said capacitor element is formed on a semiconductor substrate.

4. The laminated thin-film device according to claim 3, wherein said semiconductor substrate is made from at least one element selected from the group consisting of Si, Ge, and IIIA group elements and VA group elements of the periodic table.

5. The laminated thin-film device according to claim 2, wherein one or more insulation layers made from a material selected from the group consisting of an oxide, a nitride, an oxynitride, a xerogel, and a mixture thereof, are formed over the semiconductor substrate.

6. The laminated thin-film device according to claim 2, wherein one or more adhesive layers made from a conductive or insulating material selected from the group consisting of a metal, an alloy, a metal oxide, a metal nitride, and a mixture thereof are provided over said semiconductor.

7. The laminated thin-film device according to claim 2, wherein said electrode layers are made from a material selected from the group consisting of a transition metal, a noble metal, an alloy containing noble metal, and a conductive noble metal oxide.

8. The laminated thin-film device according to claim 2, wherein said insulating layer is made from a material having a perovskite crystal structure expressed by the structural formula $ABO_3$ (wherein B is one or more elements selected from the group consisting of IVB group, VB group, VIB group, VIIB group and IB group elements of the periodic table, and A is one or more elements having electric charges in the range from +1 to +3).

9. The laminated thin-film device according to claim 8, wherein the ion implanted into said well region is an ion that has an electric charge lower than said A.

10. The laminated thin-film device according to claim 8, wherein the ion implanted into said well region is an ion that has an electric charge higher than said A.

11. The laminated thin-film device according to claim 8, wherein the ion implanted into said well region is an ion that has an electric charge lower than said B.

12. The laminated thin-film device according to claim 8, wherein the ion implanted into said well region is an ion that has an electric charge higher than said B.

13. The laminated thin-film device according to claim 2, wherein said insulating layer is made from a material having a pyrochlore structure expressed by the structural formula $A'_2B'_2O_x$ (wherein x is 6 or 7, B' is one or more elements selected from the group consisting of IVB group, VB group, VIB group, VIIB group and IB group elements of the periodic table, and A' is one or more elements having electric charges in the range from +1 to +3).

14. The laminated thin-film device according to claim 13, wherein the ion implanted into said well region is an ion that has an electric charge lower than said A'.

15. The laminated thin-film device according to claim 13, wherein the ion implanted into said well region is an ion that has an electric charge higher than said A'.

16. The laminated thin-film device according to claim 13, wherein the ion implanted into said well region is an ion that has an electric charge lower than said B'.

17. The laminated thin-film device according to claim 13, wherein the ion implanted into said well region is an ion that has an electric charge higher than said B'.

18. The laminated thin-film device according to claim 2, wherein said insulating layer is made from a material selected from the group consisting of barium titanate, strontium titanate, barium strontium titanate, bismuth titanate, strontium bismuth tantalate, strontium bismuth niobate, strontium bismuth niobate tantalate, lead zirconate titanate, lanthanum lead titanate zirconate, potassium niobate, magnesium lead niobate, and those substances having an ion implanted therein.

19. The laminated thin-film device according to claim 2, wherein the laminated thin-film device is a decoupling capacitor.

20. A circuit, wherein capacitor elements are connected in parallel or in series or in a combination of parallel and series, and each of the capacitor elements comprises:
   a pair of electrode layers;
   an insulating layer disposed between said electrode layers; and a well region disposed in said insulating layer for shifting or shifting and expanding the capacitance-voltage curve between said electrode layers in at least one direction of the plus direction and minus direction with respect to the voltage axis,
   wherein each said well defines one part of the top boundary face of said insulating layer or one part of the bottom boundary face of said insulating layer.

* * * * *